(12) United States Patent
Oepts

(10) Patent No.: US 6,295,225 B1
(45) Date of Patent: Sep. 25, 2001

(54) MAGNETIC TUNNEL JUNCTION DEVICE HAVING AN INTERMEDIATE LAYER

(75) Inventor: Wouter Oepts, Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/541,079

(22) Filed: Mar. 31, 2000

(30) Foreign Application Priority Data

May 14, 1999 (EP) .................................................. 99201515

(51) Int. Cl.[7] .................................................. G11C 11/14
(52) U.S. Cl. .......................................... 365/171; 365/173
(58) Field of Search .................................. 365/158, 171, 365/173

(56) References Cited

U.S. PATENT DOCUMENTS 5,650,958 * 7/1997 Gallagher et al. .................... 365/173
5,764,567 * 6/1998 Parkin .................................. 365/173
5,966,012 * 10/1999 Parkin .................................. 365/158

OTHER PUBLICATIONS

John G. Simmons, "Generalized Formula for the Electric Tunnel Effect Between Similar Electrodes Separated by a Thin Insulating Film", Journal of Applied Physics, vol. 34, No. 6, Jun. 1963, pp. 1793–1803.

McGraw Hill Encyclopedia of Science and Technology, 1960, pp. 553.

H.–J. Drouhin Et Al, Spin–Dependent Transmission of Free Electronics Through Ultrathin Cobalt Layers (Invited), Journal of Appl. Phys. 79(8), Apr. 15, 1996, pp. 4734–4739.

* cited by examiner

*Primary Examiner*—Trong Phan
(74) *Attorney, Agent, or Firm*—Michael E. Belk

(57) ABSTRACT

A magnetic tunnel junction device has a multi-layer structure including a pair of electrode layers of a ferromagnetic material and a tunnel barrier layer of an insulating material between the electrode layers. In order to realize a low resistance, the multi-layer structure also includes an intermediate layer provided between the barrier layer and one of the electrode layers and including a conductive material having a work function with a value which is at least 25% lower than the value of the work function of the material of the respective electrode layer.

12 Claims, 3 Drawing Sheets

MAGNETIC TUNNEL JUNCTION DEVICE HAVING AN INTERMEDIATE LAYER

FIELD OF THE INVENTION

The invention is related to the field of tunnel junction devices.

BACKGROUND OF THE INVENTION

The invention relates to a magnetic tunnel junction device provided with a multilayer structure including a pair of electrode layers of a ferromagnetic material and an interposed tunnel barrier layer of insulating material.

Such a device is known from U.S. Pat. No. 5,650,958. The known device has two ferromagnetic electrode layers and an insulating tunnel barrier layer located between and in contact with both ferromagnetic layers. The insulating layer is thin enough to allow quantum mechanical tunneling between the electrode layers. The known tunnel junction device demonstrates a better magnetoresistance response than anisotropic magnetoresistive devices or giant magnetoresistive devices It is known per se from e.g. the article "Generalized Formula for the Electric Tunnel Effect between Similar Electrodes Separated by a Thin Insulating Film", Journal of Applied Physics, Volume 34, number 6, June 1963, pages 1793–1803, John C. Simmons, that the tunnel resistance of a device, that includes two electrodes separated by a thin insulating film, depends on the thickness of the insulating film and the value of the tunnel barrier height. In order to guarantee electric and magnetic insulations between the two electrodes, a certain minimal thickness of the insulating film is required. The barrier height is physically determined by the combination of electrode material and insulating film material.

The above citations are hereby incorporated herein in whole by reference.

The inventors recognize that in the known tunnel junction device, the tunnel junction resistance is relatively high and thereby has a restricted current-voltage characteristic.

SUMMARY OF THE INVENTION

It is an object of the invention to provide a magnetic tunnel junction device having a relatively low resistance.

According to the invention, this object is achieved in a magnetic tunnel junction device as defined in the opening paragraph, wherein the multi-layer structure further includes an intermediate layer provided between the barrier layer and one of the electrode layers. The intermediate layer includes a conductive material having a work function, with a value at least 25% lower than the value of the work function of the material of the respective electrode layer.

For the sake of clarity it is expressed that the term work function means the electronic work function as defined in McGraw-Hill Encyclopedia of Science and Technology, 1960, page 553. This work function, which is directly related to the electronic properties of a solid material, is usually expressed in electron Volts (eV). This encyclopedia teaches that the work function of a metal is equal to the energy required to raise an electron with the Fermi energy to the energy level corresponding to an electron at rest in vacuum; at absolute zero, the energy of the most energetic electrons in a metal is referred to as the Fermi energy. The barrier layer in the device according to the invention is e.g. an insulating oxide layer, preferably a layer of $Al_2O_3$. The invention is based on the insight that the barrier height between the barrier layer and an electrode layer of a tunnel junction device decreases if an intermediate layer, particularly a metallic layer, of a relatively low work function material is applied between the electrode layer and the barrier layer. Any material having a large positive electronegativity may be used, in principle, as a low work function material. Preferred examples are the metals Cs, Ba, Sr, Y. A possible further metal may be Sc.

An advantage of the device according to the invention is that a low resistance is obtained with maintenance of a normal barrier thickness. Therefore, there is no need to further reduce the thickness of the barrier layer. It is noted that, by way of example, it has appeared that a reduction of the barrier height from 4 eV to 3 eV may yield a resistance reduction by a factor of about 185. A reduction of the barrier height from 2 eV to 1 eV may even yield a resistance reduction by a factor of about 2800.

It is to be noted that, it is known per se from the Journal of Appl. Phys. 79(8), Apr. 15, 1996; "Spin-dependent transmission of free electronics through ultrathin cobalt layers"; H. -J. Drouhin c.s., that the work function of a gold layer can be lowered down from about 4 eV above the Fermi level to 2 eV by deposition of cesium. However, there is not any teaching in that publication that such a work function reduction may be of any advantage in a magnetic tunnel junction device.

In an embodiment of the device according to the invention, the intermediate layer is only provided on one side of the barrier layer.

Although in general an intermediate layer is provided on both sides of the barrier layer, it may be of interest in some applications to use only one intermediate layer. In this embodiment, which is only provided with one intermediate layer, an asymmetrical tunnel barrier is formed. Such a device is virtually a ferromagnetic diode wherein at lower voltages between the electrode layers the tunnel current densities are the same in both current directions between the electrode layers, while at higher voltages the current density in the one direction is higher than in the other direction. A device having such properties is suitable for use in certain memory structures, such as MRAM structures.

The invention further relates to a magnetic field sensor including a transducing element. In the sensor according to the invention, the transducer element is formed by the magnetic tunnel junction device according to the invention. This sensor has all of the advantages of the tunnel junction device according to the invention and is very suitable to detect magnetic field variations. The sensor may also be used as a shielded read head.

The invention further relates to a magnetic head. The magnetic head according to the invention it includes the magnetic field sensor according to the invention and is provided with a magnetic yoke for cooperation with the magnetic tunnel junction device. This magnetic head has all of the advantages of the sensor according to the invention and is very suitable as a read head for reading information, such as audio, video or data information, from a magnetic information carrier.

The invention further relates to a system for reading information from a magnetic information carrier or record carrier. This system according to the invention includes the magnetic field sensor or the magnetic head according to the invention. The information carrier may be a magnetic tape or a disc-shaped carrier, such as a hard disc or a magneto-optical disc.

The invention also relates to a magnetic tunnel junction memory cell. A memory cell is known per se from U.S. Pat.

No. 5,650,958. The memory cell according to the invention includes the magnetic tunnel junction device described above according to the invention.

The above-mentioned and other aspects of the invention are apparent from and will be elucidated, by way of non-limitative example, with reference to the embodiments described hereinafter.

DETAILED DESCRIPTION OF THE PREFERRED EMBODIMENT

Figure 1:
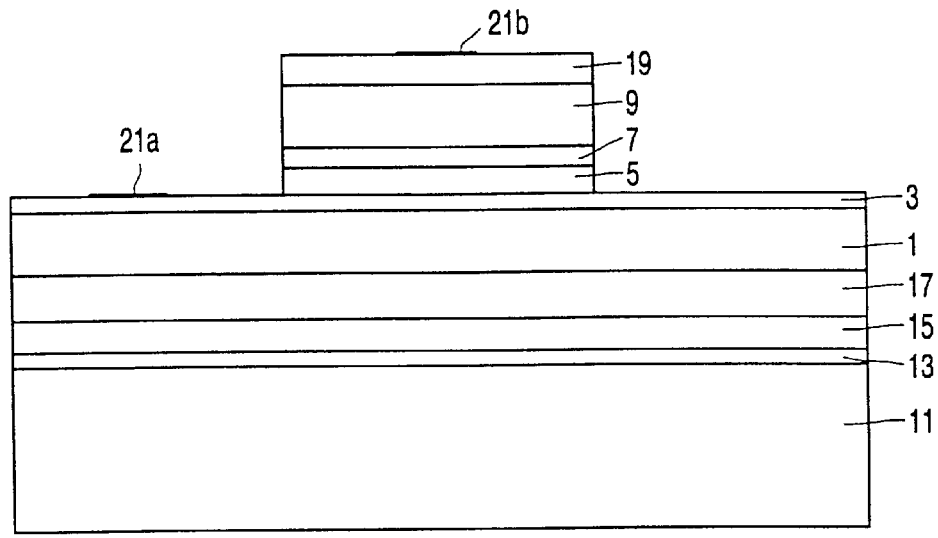
FIG. 1 is a diagrammatic cross-sectional view of an embodiment of the magnetic field sensor according to the invention provided with a first embodiment of the magnetic tunnel junction device according to the invention.

The magnetic tunnel junction device applied in the sensor according to the invention, shown in FIGS. 1, has a multi-layer structure including a first electrode layer 1, a first intermediate layer 3, a barrier layer 5, a second intermediate layer 7 and a second electrode layer 9. Both electrode layers 1 and 9 are formed from a ferromagnetic material; in this example the first electrode layer 1 includes an NiFe alloy sublayer and a Co sublayer, the second electrode layer 9 being identical to the first electrode layer 1. Alternatively, the first electrode layer 1 may be e.g. a Co layer and the second electrode layer 9 may be e.g. a CoFe alloy layer. The barrier layer 5 is formed from an insulating material, particularly $Al_2O_3$. Both intermediate layers 3 and 7, which may be very thin, include each an electrically conductive material, in this example Cs (cesium), having a work function with a value which is considerably lower than the value of the work function of the materials, i.e. NiFe alloy and Co, respectively, of the electrode layers 1 and 9. The value of the work function of Cs is about 1.95 eV; the value of the work function of NiFe alloy and Co is about 5 eV.

The shown sensor further has a substrate 11, (e.g. a non-magnetic substrate) formed from silicon on which substrate 11 an adhesive layer 13 (e.g. Ta), a buffer layer 15 (e.g. an NiFe alloy and an exchange biasing layer 17 e.g. an FeMn alloy) are present. The second electrode layer 9 is covered by a cap layer 19 e.g. Ta. Furthermore, the shown sensor has two electrical connection means, such as connection faces 21a and 21b, for connecting the magnetic tunnel junction device to an external current source.

Figure 2:
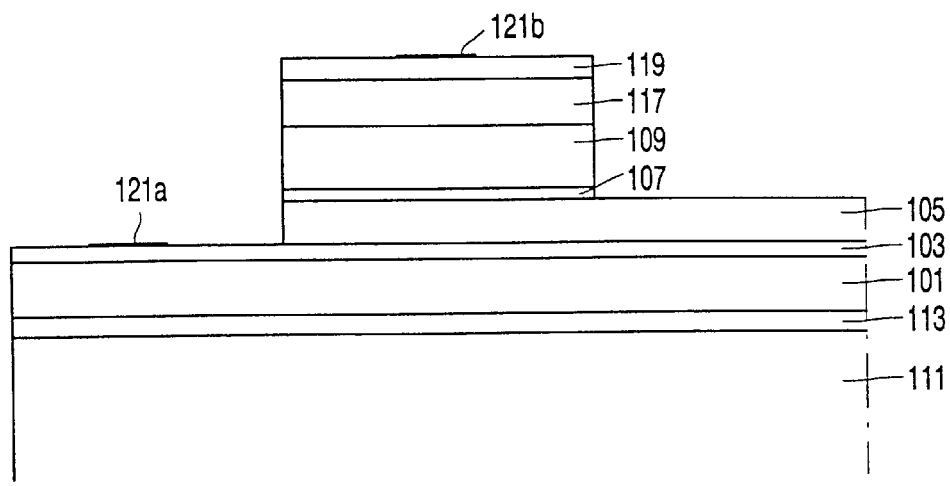
FIG. 2 is a diagrammatic cross-sectional view of a second embodiment of the magnetic tunnel junction device according to the invention.

The magnetic tunnel junction device shown in FIG. 2 is provided with a multi-layer structure including a pair of electrode layers 101 and 109 of a ferromagnetic material, for example, an NiFe alloy such as $Ni_{80}Fe_{20}$ and a CoFe alloy, respectively, an interposed tunnel barrier layer 105 of an insulating oxidic material, such as $Al_2O_3$, and two intermediate layers 103 and 107 provided between the barrier layer 105 and the electrode layers 101 and 109. Both intermediate layers include a conductive material having a work function with a value which is considerably, i.e. at least 25%, lower than the value of the work function of the material(s) of the electrode layers 101 and 109. Suitable low work function materials are e.g. Cs, Ba, Sr and Y having a work function value of about 1,95; 2,32; 2,40; and 3,20 eV, respectively. The work function value of NiFe alloy and CoFe alloy is about 5 eV. The multi-layer structure is provided on a substrate 111, an adhesive layer 113 of e.g. Ta being present in order to improve the adhesion between the multilayer structure and the substrate 111. The substrate 111 can be made of $SiO_2$. In order to pin the magnetization of the electrode layer 109 use is made of an exchange-biasing layer 117 of an antiferromagnetic material, such as an FeMn alloy or an IrMn alloy. The electrode layer 109 is a so-called pinned ferromagnetic layer whose magnetization is oriented in the plane of the layer but is fixed so as to not be able to rotate in the presence of an applied magnetic field. The electrode layer 101 is a so-called free ferromagnetic layer whose magnetization can be rotated in the plane of the layer relative to the fixed magnetization of the electrode layer 109. The layer 117 is covered by an electrically conductive protective layer 119. The layers 103 and 119 are provided with connection faces 121a and 121b. It is to be noted that one of the electrode layers may be lacking in the device for certain applications of the device.

Figure 3:
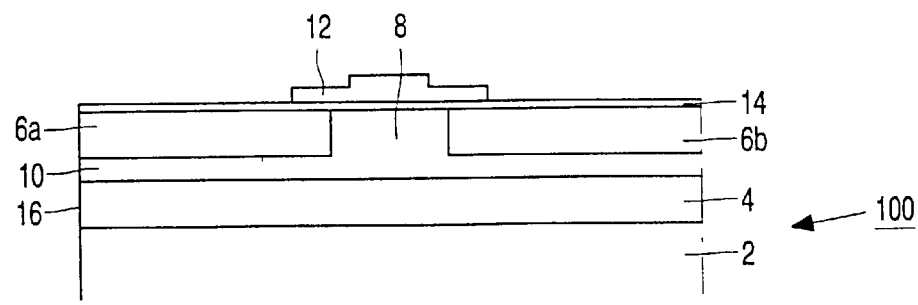
FIG. 3 is a diagrammatic cross-sectional view of an embodiment of the magnetic head according to the invention.

The magnetic head according to the invention, shown in FIG. 3, is a so-called thin-film magnetic head. The head, indicated by 100 includes a substrate 2 and a thin-film structure provided on the substrate 2. The substrate 2 may be a non-magnetic substrate of e.g. $Al_2O_3/TiC$. The thin-film structure two magnetically permeable films 4 and 6a, 6b of, for example, an NiFe alloy or a CoNbZn alloy, each film serving as a flux guide. The film 6a, 6b is divided into two film portions 6a and 6b, respectively, a space 8 filled up with a non-magnetic material extending between both film portions 6a and 6b. The non-magnetic material may be $SiO_2$ or $Al_2O_3$. Such a material is also present between the films 4 and 6a, 6b forming a gap film 10. The magnetic head 100 further includes an embodiment 12 of the magnetic tunnel junction device according to the invention. In this example the magnetic tunnel junction device 12 is of a kind as shown in FIG. 2. An insulation film 14 may be provided between the magnetically permeable film 6a, 6b and the tunnel junction device 12. The magnetic head 100 is provided with a head face 16, which may be a contact face, for cooperation with an information recording carrier, such as a magnetic tape or a hard disc. The magnetic head 100 may be further provided with a non-magnetic plate-shaped protective block so as to protect the structure formed by the thin-film structure and the magnetic tunnel junction device.

Figure 4A:
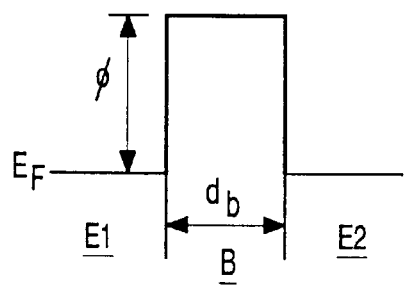
FIGS. 4A, 4B and 4C are diagrammatic representations of the energy diagrams of magnetic tunnel junction devices with zero applied voltage.
Figure 4B:
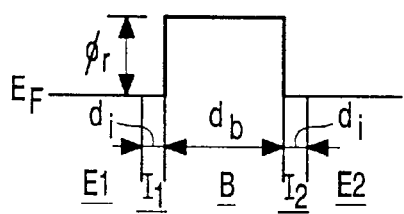
Figure 4C:
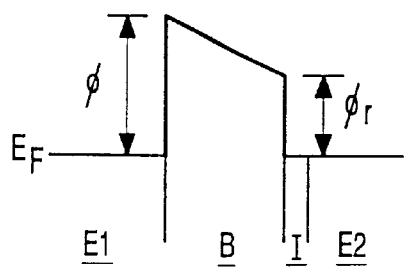

In FIG. 4a an energy diagram is shown for a known magnetic tunnel junction device of a kind known from, for example, U.S. Pat. No. 5,650,958 already mentioned in the introduction of the description. Such a magnetic tunnel junction device has two electrode layers E1 and E2 of e.g. Co and an insulation tunnel barrier layer B located between and in contact with both electrode layers. The Fermi level EF of both electrode layers is at the same level. The barrier height $\phi$ is defined as the height of the barrier above the Fermi level; the barrier layer thickness is indicated by $d_b$. In FIG. 4B an energy diagram is shown for an embodiment of the magnetic tunnel junction device according to the invention. In this embodiment the magnetic tunnel junction device is provided with two electrode layers E1 and E2, a tunnel barrier layer B and two intermediate layers I1 and I2 provided between the barrier layer B and the electrode layer E1 and between the barrier layer B and the electrode E2, respectively. Both intermediate layers I1 and I2 include a conductive material, such as Cs, having a work function with a value which is at least 25% lower than the value of the work function of the material, such as Co, of the electrode layer E1 and E2. The thickness of the barrier layer B is indicated by $d_b$; the thickness of each of the intermediate layers I1 and I2 is indicated by $d_i$. The barrier height $\phi_r$ is considerably lower than the barrier height $\phi$ due to the presence of the specific intermediate layers I1 and I2. The energy diagram depicted in FIG. 4C relates to another embodiment of the magnetic tunnel junction device according to the invention. This embodiment has only one intermediate layer instead of two intermediate layers. This intermediate layer, indicated by I, is provided between the barrier layer B and one of the electrode layers E1 and E2; in this example layer E2. Due to the intermediate layer I the device has an asymmetric barrier, the energy diagram having two different barrier heights $\phi$ and $\phi_r$ for the electrode layer E1 and the electrode layer E2, respectively. Such a device may be used as a ferromagnetic diode because there is a difference in the flow of electron current in the one direction with regard to the flow of electron current in the other direction if the applied voltages are above a certain level. In the example of FIG. 4C the electron current can be larger in the direction from E2 to E1 than in the opposite direction. This asymmetric behaviour of the current can also be derived from the paper of John G. Simmons already mentioned in the introduction of the description; particularly the equation (44) on page 1800 of that paper is of interest in this context.

Figure 5A:
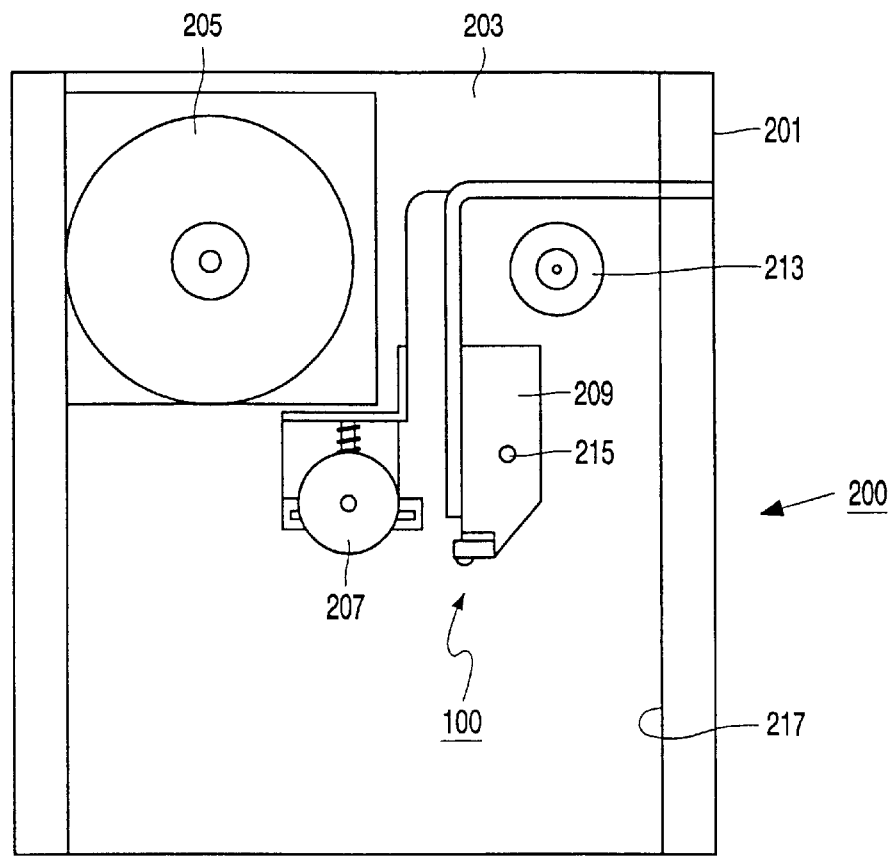
FIGS. 5A and 5B show diagrammatically an embodiment of the system according to the invention.
Figure 5B:
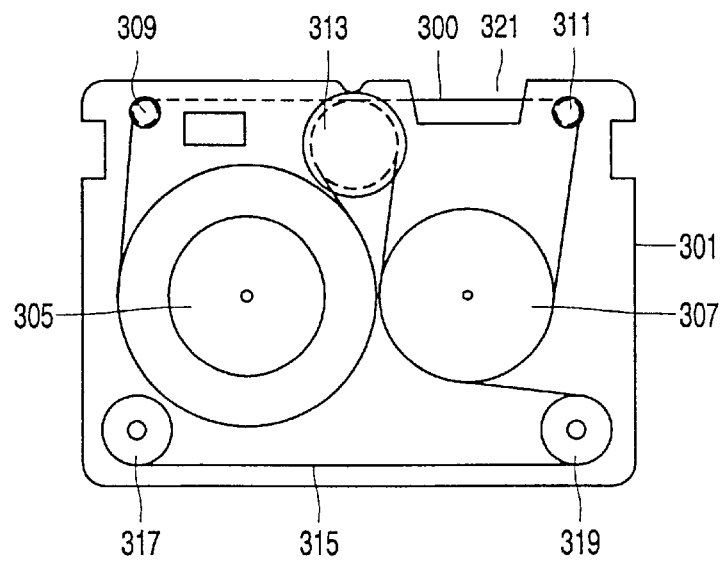

The system according to the invention, shown in the FIGS. 5A and 5B, includes an apparatus 200 for scanning a magnetic record carrier and the magnetic record carrier, which is a magnetic tape 300 in this embodiment. The apparatus 200 is suitable for reading the magnetic tape 300, which, in this embodiment, is present in a cassette 301. The apparatus 200 has a housing 201 with a frame 203. The housing 201 accommodates, inter alia, a drive motor 205 for driving a drive roller 207 and a magnetic head according to the invention, which, in this embodiment, is the magnetic head 100 disclosed in FIG. 3. The magnetic head 100, is in this embodiment, secured to a sub-frame 209 which is movable along a guiding shaft 215 by means of a drive motor 213. The apparatus 200 also has a straight guiding member 217 for sliding the cassette 301 into an out of the housing 201. The cassette 301 may be used, for example, for storing information in a digital form. The cassette 301 has two reels 305 and 307 on which a part of the magnetic tape 300 is present. The part of the magnetic tape 300 present between the two reels is guided past two tape-guiding members 309 and 311 which are stationary in this embodiment and runs past a capstan 313. The cassette 301 includes an endless drive belt 315 which runs past the capstan 313, the reels 305 and 307 and two belt-guiding members 317 and 319. In an operating state, in which the cassette 301 cooperates with the apparatus 200, the magnetic head 100 projects into a recess 321 in the cassette and is then in contact with the magnetic tape 300. Simultaneously, the drive roller 207 is in contact with the capstan 313 via which the magnetic tape 300 is longitudinally movable from one reel to the other. From the above it will be clear that the system according to the invention has means for guiding the magnetic information carrier past the magnetic head, the apparatus having moreover means for moving the magnetic head relative to the information carrier.

The apparatus shown is a data storage apparatus and may be, for example, an audio and/or video apparatus. The system may be adapted in such a way that the record carrier is a magnetic disc or a magnetic card instead of a magnetic tape.

It is to be noted further that the invention is not limited to the described embodiments but, within the scope of the claims, relates to all types of magnetic tunnel junction devices as well as sensors, magnetic heads and memory cells including such a junction device and systems including such a sensor, magnetic head or memory cell.+

The invention has been disclosed with reference to specific preferred embodiments, to enable those skilled in the art to make and use the invention, and to describe the best mode contemplated for carrying out the invention. Those skilled in the art may modify or add to these embodiments or provide other embodiments without departing from the spirit of the invention. The scope of the invention is not limited to the embodiments, but lies in each and every novel feature or combination of features described above and in every novel combination of these features. Thus, the scope of the invention is only limited by the following claims:

What is claimed is:

1. A magnetic tunnel junction device provided with a multi-layer structure comprising
    a pair of electrode layers of a ferromagnetic material;
    a tunnel barrier layer of an insulating material, interposed between the electrode layers; and
    an intermediate layer provided between the tunnel barrier layer and one of the electrode layers, which intermediate layer includes a conductive material having a work function with a value which is at least 25% lower than a value of a work function of the material of the one electrode layer.

2. The device according to claim 1, in which the material of the intermediate layer includes a metal of a group including: Cs, Ba, Sr and Y.

3. The device according to claim 1, in which the intermediate layer is only provided on one side of the barrier layer.

4. The device according to claim 2, in which the intermediate layer is only provided on one side of the barrier layer.

5. A magnetic field sensor comprising:
    a transducer element formed by a magnetic tunnel junction device including:
        a pair of electrode layers of a ferromagnetic material;
        a tunnel barrier layer of an insulating material, interposed between the electrode layers; and
        an intermediate layer provided between the tunnel barrier layer and one of the electrode layers, which intermediate layer includes a conductive material having a work function with a value which is at least 25% lower than a value of a work function of the material of the one electrode layer;
    the sensor further comprising an output for a magnetic field signal.

6. The sensor according to claim 5, in which:
    the material of the intermediate layer includes a metal of a group including: Cs, Ba, Sr and Y; and
    the intermediate layer is only provided on one side of the barrier layer.

7. The magnetic head comprising:
    a magnetic field sensor having a transducer element formed by a magnetic tunnel junction device including:
    a pair of electrode layers of a ferromagnetic material;
    a tunnel barrier layer of an insulating material, interposed between the electrode layers; and
    an intermediate layer provided between the tunnel barrier layer and one of the electrode layers, which intermediate layer includes a conductive material having a work function with a value which is at least 25% lower than a value of a work function of the material of the one electrode layer;

the magnetic head further comprising a magnetic yoke for cooperation with the magnetic tunnel junction device.

8. The head according to claim 7, in which:

the material of the intermediate layer includes a metal of a group including: Cs, Ba, Sr and Y; and the intermediate layer is only provided on one side of the barrier layer.

9. A system for reading information from a magnetic information carrier, the system comprising:

a magnetic field sensor with a transducer element formed by a magnetic tunnel junction device including:
  a pair of electrode layers of a ferromagnetic material;
  a tunnel barrier layer of an insulating material, interposed between the electrode layers; and
  an intermediate layer provided between the tunnel barrier layer and one of the electrode layers, which intermediate layer includes a conductive material having a work function with a value which is at least 25% lower than a value of a work function of the material of the one electrode layer;

the system further comprising an output for information read from the information carrier.

10. The system according to claim 9, in which:

the material of the intermediate layer includes a metal of group including: Cs, Ba, Sr and Y; and the intermediate layer is only provided on one side of the barrier layer.

11. A magnetic tunnel junction memory cell comprising:

a magnetic tunnel junction device including:
  a pair of electrode layers of a ferromagnetic material;
  a tunnel barrier layer of an insulating material, interposed between the electrode layers; and
  an intermediate layer provided between the tunnel barrier layer and one of the electrode layers, which intermediate layer includes a conductive material having a work function with a value which is at least 25% lower than a value of a work function of the material of the one electrode layer;

the memory cell further comprising an output for information stored in the memory cell.

12. The device according to claim 11, in which:

the material of the intermediate layer includes a metal of a group including: Cs, Ba, Sr and Y; and the intermediate layer is only provided on one side of the barrier layer.

* * * * *